: (12) United States Patent
Liao et al.

(10) Patent No.: US 7,560,862 B2
(45) Date of Patent: Jul. 14, 2009

(54) WHITE OLEDS WITH A COLOR-COMPENSATED ELECTROLUMINESCENT UNIT

(75) Inventors: Liang-Sheng Liao, Rochester, NY (US); Tukaram K. Hatwar, Penfield, NY (US); Kevin P. Klubek, Webster, NY (US); Dustin L. Comfort, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 574 days.

(21) Appl. No.: 10/970,928

(22) Filed: Oct. 22, 2004

(65) Prior Publication Data
US 2006/0087225 A1 Apr. 27, 2006

(51) Int. Cl.
*H05B 33/14* (2006.01)
*H05B 33/00* (2006.01)
*H01L 51/50* (2006.01)
*H01J 1/62* (2006.01)

(52) U.S. Cl. .............. 313/506; 428/690; 428/917; 313/504; 313/508

(58) Field of Classification Search .......... 313/502–506
See application file for complete search history.

(56) References Cited

U.S. PATENT DOCUMENTS

| 3,826,801 | A | * | 7/1974 | Cieciuch et al. ............ 534/682 |
| 4,769,292 | A |   | 9/1988 | Tang et al. |
| 4,885,211 | A |   | 12/1989 | Tang et al. |
| 5,683,823 | A |   | 11/1997 | Shi et al. |
| 5,703,436 | A |   | 12/1997 | Forrest et al. |
| 5,757,139 | A | * | 5/1998 | Forrest et al. ............ 315/169.3 |
| 5,874,803 | A | * | 2/1999 | Garbuzov et al. .......... 313/506 |
| 6,107,734 | A |   | 8/2000 | Tanaka et al. |
| 6,215,244 | B1 | * | 4/2001 | Kuribayashi et al. ........ 313/505 |
| 6,337,492 | B1 |   | 1/2002 | Jones et al. |
| 6,582,838 | B2 | * | 6/2003 | Burrows et al. ............. 428/690 |
| 6,661,029 | B1 | * | 12/2003 | Duggal ....................... 257/89 |
| 6,696,177 | B1 | * | 2/2004 | Hatwar ....................... 428/690 |
| 6,717,358 | B1 |   | 4/2004 | Liao et al. |
| 6,995,509 | B2 |   | 2/2006 | Yamazaki et al. |

(Continued)

FOREIGN PATENT DOCUMENTS

JP 07-142169 6/1995

(Continued)

OTHER PUBLICATIONS

Kido et al., Applied Physics Letters, 64, 815 (1994).

(Continued)

*Primary Examiner*—Sikha Roy
*Assistant Examiner*—Tracie Y Green
(74) *Attorney, Agent, or Firm*—Raymond L. Owens

(57) ABSTRACT

A tandem white OLED includes an anode; a cathode; at least one broadband electroluminescent unit disposed between the anode and the cathode, wherein the broadband electroluminescent unit includes at least one light-emitting layer and produces at least one color component having an intensity less than desired; at least one color-compensating electroluminescent unit disposed between the anode and the cathode, wherein the color-compensating electroluminescent unit is selected to produce the at least one color component and to increase the color component intensity; and an intermediate connector disposed between each adjacent electroluminescent unit, wherein the intermediate connector has no direct connection to an external power source.

5 Claims, 8 Drawing Sheets

U.S. PATENT DOCUMENTS

| | | |
|---|---|---|
| 7,113,154 B1 * | 9/2006 | Inukai .......................... 345/76 |
| 7,126,267 B2 * | 10/2006 | Liao et al. .................... 313/500 |
| 2003/0099860 A1 | 5/2003 | Lin et al. |
| 2003/0170491 A1 * | 9/2003 | Liao et al. ................... 428/690 |
| 2003/0189401 A1 | 10/2003 | Kido et al. |
| 2004/0004433 A1 * | 1/2004 | Lamansky et al. ........... 313/506 |
| 2006/0172147 A1 * | 8/2006 | Matsuura et al. ............ 428/690 |
| 2006/0227079 A1 * | 10/2006 | Kashiwabara ................ 345/76 |
| 2006/0238113 A1 * | 10/2006 | Kashiwabara et al. ....... 313/504 |

FOREIGN PATENT DOCUMENTS

| | | |
|---|---|---|
| JP | 2003045676 A | 2/2003 |
| WO | 2004/060026 | 7/2004 |
| WO | 2005/115059 | 12/2005 |

OTHER PUBLICATIONS

Deshpande et al., Applied Physics Letters, 75, 888 (1999).
Tokito, et al., Applied Physics Letters, 83, 2459 (2003).
Matsumoto et al., SID 03 Digest, 979 (2003).

* cited by examiner

WHITE OLEDS WITH A COLOR-COMPENSATED ELECTROLUMINESCENT UNIT

CROSS REFERENCE TO RELATED APPLICATIONS

Reference is made to commonly assigned U.S. patent application Ser. No. 10/437,195 filed May 13, 2003 by Liao et al., entitled "Cascaded Organic Electroluminescent Device Having Connecting Units with n-Type and p-Type Organic Layers"; U.S. patent application Ser. No. 10/857,516 filed May 28, 2004 by Liang-Sheng Liao et al., entitled "Tandem OLED Having Stable Intermediate Connectors"; U.S. patent application Ser. No. 10/882,834 filed Jul. 1, 2004 by Tukaram K. Hatwar et al., entitled "High Performance White Light-Emitting OLED Device"; and U.S. patent application Ser. No. 10/922,606 filed Aug. 20, 2004 by Liang-Sheng Liao et al., entitled "White OLED Having Multiple White Electroluminescence Units", the disclosures of which are herein incorporated by reference.

FIELD OF INVENTION

The present invention relates to providing a plurality of organic electroluminescent (EL) units to form a tandem white organic electroluminescent device.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle and capability for full-color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. There is an increasing demand for broadband OLEDs to be incorporated into various applications, such as a solid-state lighting source or a full-color display. By broadband emission, it is meant that an OLED emits sufficiently wide light throughout the visible spectrum so that such light can be used in conjunction with filters to produce a full-color display. In particular, there is a need for white light OLEDs (or white OLEDs) where there is substantial emission in the red, green, and blue portions of the spectrum, wherein a white-emitting EL layer can be used to form a multicolor device in conjunction with filters. The emission of a white OLED device generally has 1931 Commission Internationale d'Eclairage (CIE) chromaticity coordinates, (CIEx, CIEy), of about (0.33, 0.33). White OLEDs have been reported in the prior art, such as reported by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito et al. in *Applied Physics Letters*, 83, 2459 (2003).

In order to achieve broadband emission from an OLED, more than one type of molecule has to be excited because each type of molecule only emits light with a relatively narrow spectrum under normal conditions. A LEL comprising a host material and one or more than one luminescent dopant can achieve light emission from both the host and the dopant(s) resulting in a broadband emission in the visible spectrum if the energy transfer from the host material to the dopant(s) is incomplete. However, a white OLED with only one LEL will have neither a wide enough emission covering the whole visible spectrum, nor will it have a high luminance efficiency. A white OLED having two LELs can have better color as well as better luminance efficiency than the device having one LEL. However, it is difficult to achieve a wide emission with a balanced intensity from red, green, and blue colors because a white OLED having two LELs typically has only two intensive emission peaks. For example, in a commonly used white OLED having two LELs, if the colors of the LELs are yellow and greenish blue, the red primary color emission will be weak in the device; if the colors of the two LELs are red and greenish blue, the green primary color emission will be weak in the device; and if the colors of the LELs are green and red, the blue primary color will be weak. A white OLED having three LELs of different color was also proposed but it is still difficult to achieve a wide emission from the device because the most intensive light typically comes from the LEL with a dopant having the narrowest optical band gap and the emission spectrum shifts with different drive conditions.

In a full-color display using white OLEDs as the pixels, the perceived red, green, or blue color from the human eyes comes from the pixels with a red, green, or blue color filter on top of the pixels, respectively. If each of the white OLED pixels in the display has an emission including balanced red, green, and blue primary color components, the light intensity passing through the color filter is about one third of the white emission intensity. However, if the white OLED pixels do not have balanced red, green, and blue emission, one of the primary color components will have the intensity lower than one third of the white emission intensity after passing through the color filter. As a result, in order to achieve a comparable emission intensity of the specific primary color, the corresponding white OLED pixel has to be driven under higher current density causing higher power consumption and a shorter lifetime. Therefore, color compensation is needed for a conventional white OLED to achieve balanced red, green, and blue emission.

In order to improve the full color emission of an OLED, stacked OLEDs have been fabricated as disclosed by Forrest et al. in U.S. Pat. No. 5,703,436. These stacked OLEDs are fabricated by vertically stacking multiple, individually addressable OLED units, each emitting light of a different color, and wherein intra-electrodes are provided between each of the vertically stacked OLED units as a way of independently controlling the emission from each individual OLED unit in the OLED device. As a result, full color emission as well as a balanced white color emission is readily achieved. While this permits for improved color emission and a larger emission area compared to conventional full-color OLEDs, the overall construction of the OLED is complex, requiring transparent electrodes, additional bus lines for providing electrical power, as well as a separate power source for each of the stacked OLED units.

Another type of stacked OLED (or tandem OLED, or cascaded OLED) structure used for EL improvement, which is fabricated by stacking several individual OLEDs vertically and driven by only a single power source, has been proposed or fabricated by Jones et al. in U.S. Pat. No. 6,337,492, Tanaka et al. in U.S. Pat. No. 6,107,734, Kido et al. in JP Patent Publication 2003045676A and in U.S. Patent Publication 2003/0189401 A1, and Liao et al. in U.S. Pat. No. 6,717,358 and U.S. Patent Application Publication 2003/0170491 A1, the disclosures of which are herein incorporated by reference. Matsumoto et al., reported in *SID 03 Digest*, 979

(2003) that a tandem white OLED can be constructed by connecting a greenish blue EL unit and an orange EL unit in the device, and white light emission can be achieved by driving this device with a single power source. While luminance efficiency can be increased, this tandem white OLED device has weaker green and red color components in the spectrum. In U.S. Patent Application Publication 2003/0170491 A1, Liao and Tang proposed a tandem white OLED structure by connecting a red EL unit, a green EL unit, and a blue EL unit in series within the device. When the tandem white OLED is driven by a single power source, white light emission can be formed by spectral combination from the red, green, and blue EL units. While color emission and luminance efficiency can be improved, this tandem white OLED cannot be made with less than three EL units, requiring that the drive voltage be at least 3 times as high as that of a conventional OLED.

SUMMARY OF THE INVENTION

In the present invention, tandem white OLEDs are constructed using broadband EL unit(s) and color-compensating EL unit(s), and the devices are driven only using a single power source.

It is an object of the present invention to make white OLEDs having improved white color.

It is another object of the present invention to make white OLEDs having balanced red, green, and blue primary color emission in the visible spectrum.

It is another object of the present invention to make white OLEDs with high luminance efficiency and high brightness.

It is another object of the present invention to make white OLEDs with improved lifetime.

It is yet another object of the present invention to make white OLEDs with improved color stability.

It is a further object of the present invention to make tandem white OLEDs with relatively simple fabrication steps.

These objects are achieved by a tandem white OLED comprising:

a) an anode;

b) a cathode;

c) at least one broadband electroluminescent unit disposed between the anode and the cathode, wherein the broadband electroluminescent unit includes at least one light-emitting layer and produces at least one color component having an intensity less than desired;

d) at least one color-compensating electroluminescent unit disposed between the anode and the cathode, wherein the color-compensating electroluminescent unit is selected to produce the at least one color component and to increase the color component intensity; and e) an intermediate connector disposed between each adjacent electroluminescent unit, wherein the intermediate connector has no direct connection to an external power source.

The present invention makes use of color-compensating EL unit(s) in conjunction with broadband EL units in a tandem white OLED. By this arrangement, a tandem white OLED can have better broadband emission containing balanced red, green, and blue color components compared to that of a conventional white OLED. This tandem white OLED can be made with less than, but not limited to, three EL units requiring fewer fabrication steps and lower drive voltage than prior art tandem white OLEDs.

It will be understood that FIGS. 1-14 are not to scale since the individual layers are too thin and the thickness differences of various layers too great to permit depiction to scale.

DETAILED DESCRIPTION OF THE INVENTION

Several terms to be used in the following description are explained herein. The term "full-color" is employed to describe the emission color in the red, green, and blue regions of the visible spectrum. The red, green, and blue colors constitute the three primary colors from which other colors can be produced by appropriate mixing. The term "broadband emission" means that an OLED emits sufficiently wide light throughout the visible spectrum so that such light can be used in conjunction with filters to produce a full-color display. In particular, the term "white color" is employed to describe the mixing color from the red, green, and blue portions of the visible spectrum, wherein the mixing color has the Commission Internationale de l'Eclairage (CIE) coordinates of about CIEx=0.33 and CIEy=0.33. (However, the actual coordinates of a white OLED can vary significantly and still be very useful). "White light" is the light that is perceived by a user as having a white color, or the light that has an emission spectrum sufficient to be used in combination with color filters to reproduce the red, green, and blue colors for full color display applications. The term "n-type doped organic layer" means that the organic layer has semiconducting properties after doping, and the electrical current through this layer is substantially carried by the electrons. The term "p-type doped organic layer" means that the organic layer has semiconducting properties after doping, and the electrical current through this layer is substantially carried by the holes. "High work function metal" is defined as a metal having a work function no less than 4.0 eV. Likewise, "low work function metal" is defined as a metal having a work function less than 4.0 eV.

In order to appreciate the construction and the performance of the tandem white OLED comprising a plurality of white EL units and color-compensating EL units in the present invention, the prior art tandem white OLEDs will be described with reference to FIGS. 1 and 2.

Figure 1:
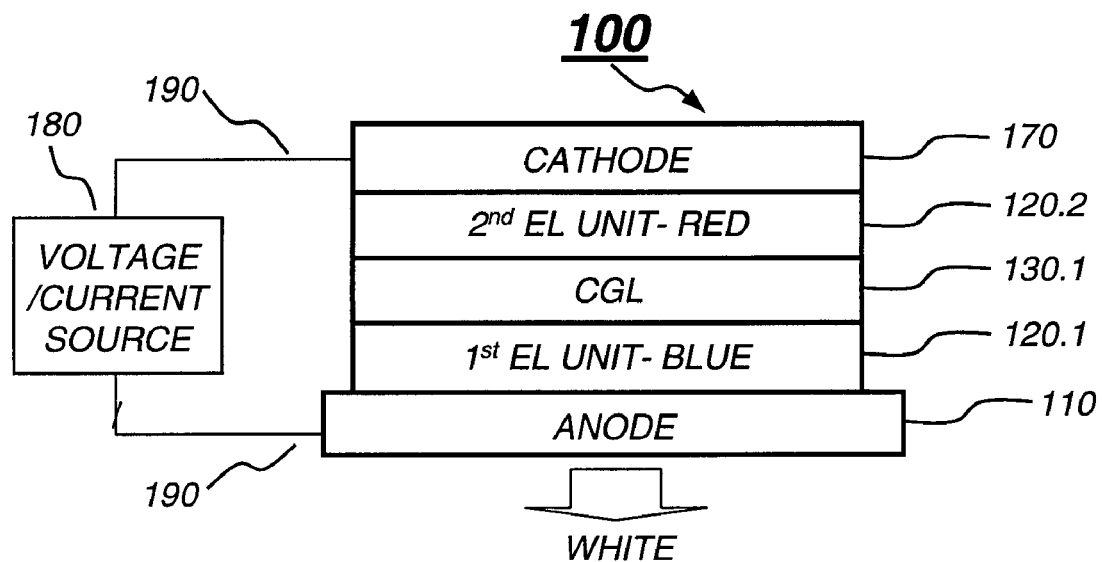
FIG. 1 depicts a schematic cross sectional view of a prior art tandem white OLED having two EL units with different emission colors.

FIG. 1 shows a prior art tandem white OLED 100. This tandem white OLED has an anode 110 and a cathode 170. Disposed between the anode and the cathode are one blue EL unit 120.1 ($1^{st}$ EL unit—blue) and one red EL unit 120.2 ($2^{nd}$ EL unit—red). These two organic EL units are stacked and connected serially to each other with a layer named charge-generating layer 130.1 (CGL), such as $V_2O_5$ or indium-tin-oxide, as an intermediate connector. When the tandem white OLED 100 is externally connected to a voltage/current source 180 through electrical conductors 190 with a forward bias, such that anode 110 is at a more positive potential with respect to the cathode 170, the $1^{st}$ EL unit and the $2^{nd}$ EL unit emit blue light and red light, respectively. The viewer can then perceive a white color from one transparent electrode of the device. The white color is the combination of the red light and the blue light.

Figure 2:
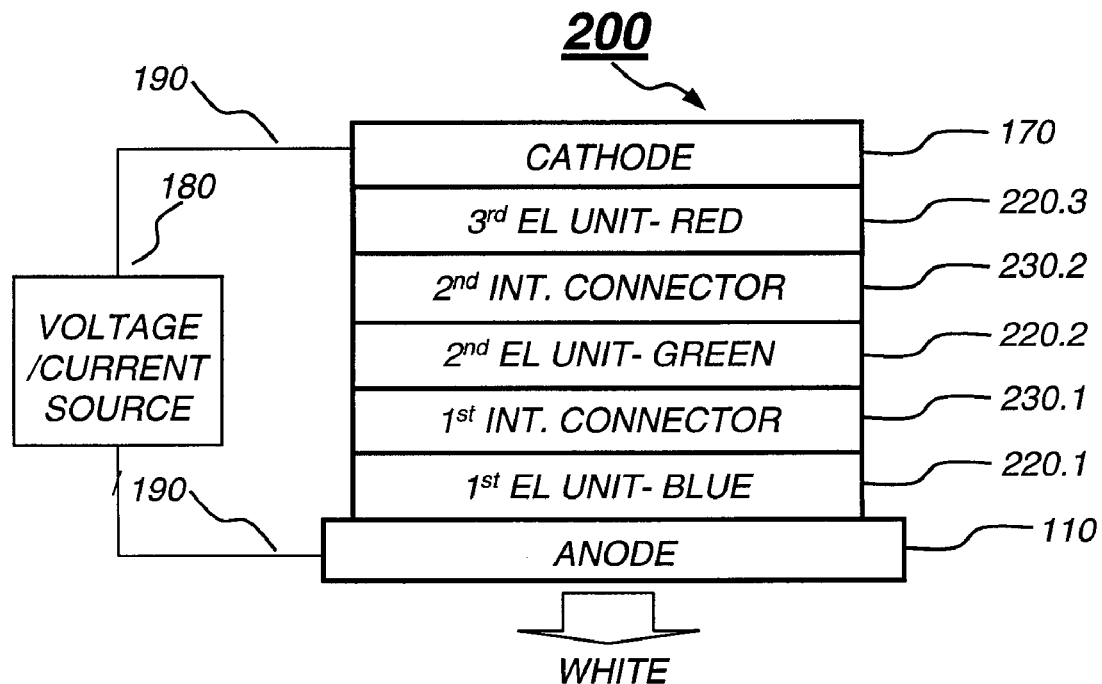
FIG. 2 depicts a schematic cross sectional view of another prior art tandem white OLED having three EL units with different emission colors.

FIG. 2 shows another prior art tandem white OLED 200. This tandem white OLED has an anode 110 and a cathode 170. Disposed between the anode and the cathode are one blue EL unit 220.1 ($1^{st}$ EL unit—blue), one green EL unit 220.2 ($2^{nd}$ nd EL unit—green), and one red EL unit 220.3 ($3^{rd}$ EL unit—red). These three organic EL units are stacked and connected serially to each other using two intermediate connectors, 230.1 ($1^{st}$ int. connector) and 230.2 ($2^{nd}$ int. connector). When the tandem white OLED 200 is externally connected to a voltage/current source 180 through electrical conductors 190 with a forward bias, the three EL units emit the blue, green, and red light, respectively. The viewer can then perceive a white color from one transparent electrode of the device. The white color is the combination of the red, green, and the blue light.

The aforementioned prior art have taught how to construct a tandem white OLED using multiple EL units having different primary color emissions from each of the EL units. However, if a white OLED is made from two EL units having two of the three primary color emissions, the device typically will have a weak intensity for the third primary color; whereas if the white OLED is made to have all three primary color emissions, this device needs at least three EL units. Moreover, since the blue emission from the blue EL unit typically degrades faster than the other color emissions from the other EL units, it is difficult for the prior art tandem white OLED to maintain the initial white color.

Figure 3:
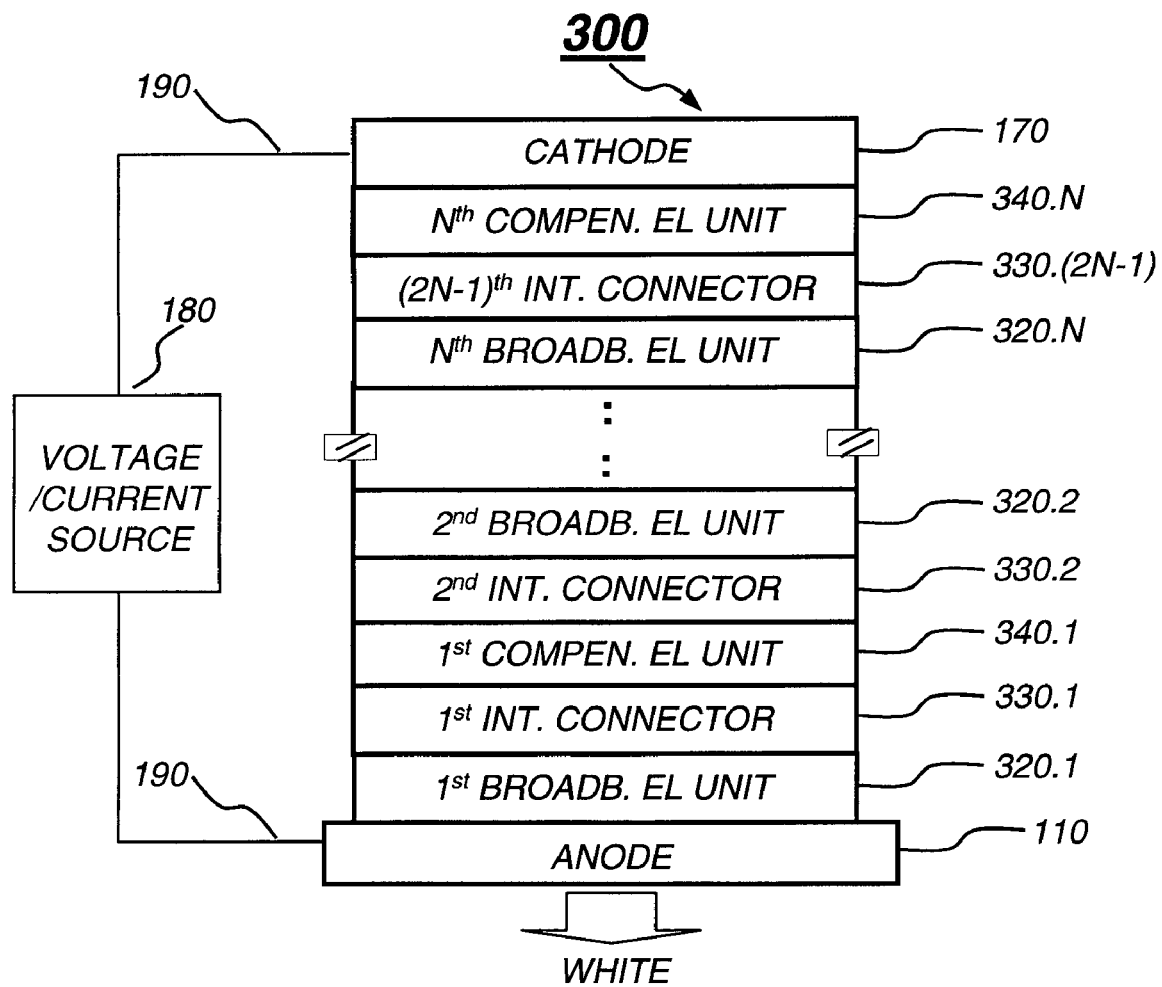
FIG. 3 depicts a schematic cross sectional view of a tandem white OLED, having N (N≧1) broadband EL units and N color-compensating EL units connected in series by 2N−1 intermediate connectors, in accordance with the present invention.

Turning now to FIG. 3, there is shown a cross-sectional view of a tandem white OLED 300 in accordance with the present invention. This tandem white OLED has an anode 110 and a cathode 170, at least one of which is transparent. Disposed between the anode and the cathode are N organic broadband EL units (each of them indicated as "broadb. EL unit" in the figure), N color-compensating EL units (each of them indicated as "compen. EL unit" in the figure), and (2N−1) intermediate connector (each of them indicated as "int. connector" in the figure), where N is an integer equal to or greater than 1. The broadband EL units, stacked and connected serially, are designated 320.1 to 320.N where 320.1 is the first broadband EL unit (adjacent to the anode), 320.2 is the second broadband EL unit, and 320.N is the $N^{th}$ broadband unit (nearby the cathode). The color-compensating EL units, stacked and connected serially, are designated 340.1 to 340.N where 340.1 is the first color-compensating EL unit (nearby the anode) and 340.N is the $N^{th}$ color-compensating unit (adjacent to the cathode). The intermediate connectors, disposed between the broadband EL unit and the color-compensating EL unit, are designated 330.1 to 330.(2N−1) where 330.1 is the first intermediate connector disposed between EL units 320.1 and 340.1, 330.2 is the second intermediate connector disposed between EL units 340.1 and 320.2, and 330.(2N−1) is the last intermediate connector disposed between EL units 320.N and 340.N. There are a total of 2N−1 intermediate connectors associated with N broadband EL units and N color-compensating EL units. The tandem white OLED 300 is externally connected to a voltage/current source 180 through electrical conductors 190.

Tandem white OLED 300 is operated by applying an electric potential produced by a voltage/current source 180 between a pair of contact electrodes, anode 110 and cathode 170. Under a forward bias, this externally applied electrical potential is distributed among the 2N EL units and the 2N−1 intermediate connectors in proportion to the electrical resistance of each of these units and connectors. The electric potential across the tandem white OLED causes holes (positively charged carriers) to be injected from anode 110 into the $1^{st}$ broadband EL unit 320.1, and electrons (negatively charged carriers) to be injected from cathode 170 into the $N^{th}$ color-compensating EL unit 340.N. Simultaneously, electrons and holes are produced in, and separated from, each of the intermediate connectors, (330.1-330.(2N−1)). Electrons thus produced, for example, in intermediate connector 330.1 are injected towards the anode and into the adjacent EL unit 320.1. Likewise, holes produced in the intermediate connector 330.1 are injected towards the cathode and into the adjacent EL unit 340.1. Subsequently, these electrons and holes recombine in their corresponding EL units to produce light.

In FIG. 3, at least one broadband EL unit produces at least one color component having an intensity less than desired, and at least one color-compensating EL unit is selected to produce the at least one color component and to increase the color component intensity. As a result, the emissive light from both the broadband EL units and the color-compensating EL units can form a balanced white color, which is observed via the transparent electrode or electrodes of the OLED.

Although the arrangement of the EL units in FIG. 3 is the repeat of a broadband EL unit followed by a color-compensating EL unit with an intermediate connector disposed in between, the arrangement of the EL units can also be the repeat of a color-compensating EL unit followed by a broadband EL unit with an intermediate connector disposed in between. Other arrangements of the EL units are also applicable provided that the device can have improved white color and improved electrical properties. For example, a color-compensating EL unit can be disposed in contact with the anode, in contact with the cathode, between two broadband EL units, or between two other color-compensating EL units.

It is noted that the number of the color-compensating EL units in FIG. 3 is equal to the number of the broadband EL units in the tandem white OLED 300. However, the number of the color-compensating EL units can be less than the number of the broadband EL units in a tandem white OLED. Moreover, there is at least one color-compensating EL unit in the tandem white OLED. Accordingly, the number of the intermediate connectors is reduced.

It is also noted that each of the color-compensating EL units in FIG. 3 can have the same color emission or have different color emission depending on how it can achieve a better white emission. The color-compensating EL units can be selected to have red color emission when the broadband EL units have a red color component with its intensity less than desired; the color-compensating EL units can be selected to have green color emission when the broadband EL units have a green color component with its intensity less than desired; and the color-compensating EL units can also be selected to have blue color emission when the broadband EL units have a blue color component with its intensity less than desired.

Figure 4:
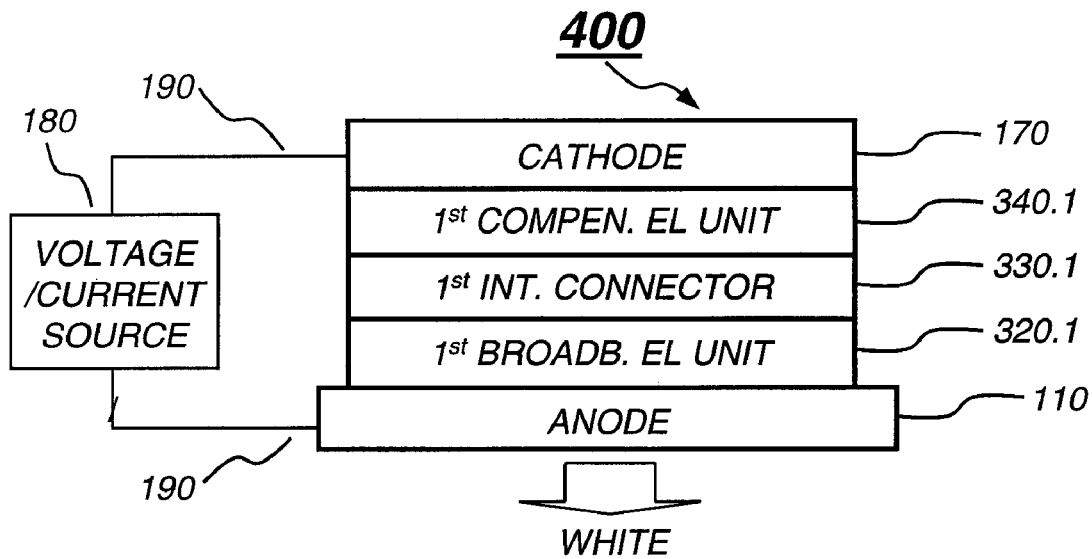
FIG. 4 depicts a schematic cross sectional view of a specific tandem white OLED, having one broadband EL unit and one color-compensating EL unit connected in series by one intermediate connector, in accordance with the present invention.

Shown in FIG. 4 is a tandem white OLED 400 having one broadband EL unit, one color-compensating EL unit, and one intermediate connector. This is a tandem structure simplified from FIG. 3 wherein N is equal to 1. Although the $1^{st}$ EL unit adjacent to the anode 110 is the broadband EL unit 320.1, and the $2^{nd}$ EL unit adjacent to the cathode 170 is the color-compensating EL unit 340.1, this arrangement order can be reversed by disposing the color-compensating EL unit in contact to the anode.

Figure 5:
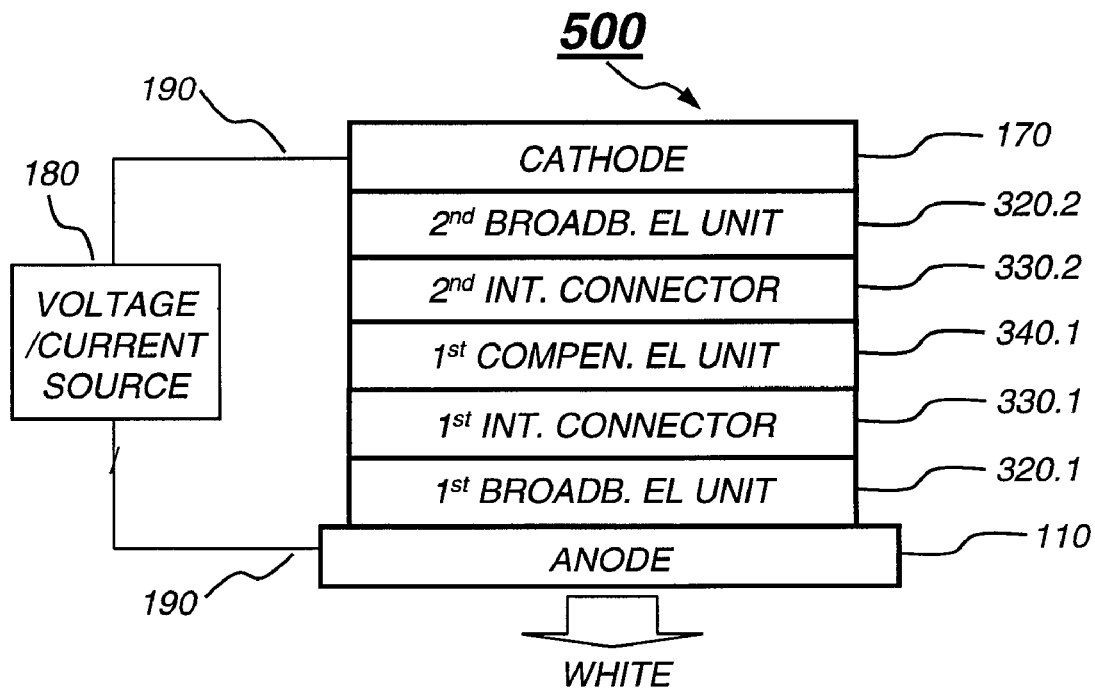
FIG. 5 depicts a schematic cross sectional view of a specific tandem white OLED, having two broadband EL units and one color-compensating EL unit connected in series by two intermediate connectors, in accordance with the present invention.

Shown in FIG. 5 is a tandem white OLED 500 having two broadband EL units, one color-compensating EL unit, and two intermediate connectors. It is also a tandem structure simplified from FIG. 3. Although the color-compensating EL unit is disposed in between the two broadband EL units, the color-compensating EL unit can be disposed in contact with either the anode 110 or the cathode 170.

Each organic EL unit (including the broadband EL unit and the color-compensating EL unit) in the tandem white OLED 300 is capable of supporting hole transport, electron transport, and electron-hole recombination to produce light. Each EL unit can comprise a plurality of layers. There are many organic EL multilayer structures known in the art that can be used as either the broadband EL unit or the color-compensating EL unit of the present invention. These include, HTL/(LEL or LELs)/ETL, hole-injecting layer (HIL)/HTL/(LEL or LELs)/ETL, HIL/HTL/(LEL or LELs)/ETL/electron-injecting layer (EIL), HIL/HTL/electron-blocking layer or hole-blocking layer/(LEL or LELs)/ETL/EIL, HIL/HTL/(LEL or LELs)/hole-blocking layer/ETL/EIL. Each EL unit in the tandem white OLED can have the same or different layer structures from other EL units provided that the combinatorial emission would be an improved white emission. However, in considering the simplicity of the fabrication, it is preferable that each broadband EL unit or each color-compensating EL unit in the tandem white OLED has the same layer structures. The layer structure of the $1^{st}$ EL unit adjacent to the anode preferably is of HIL/HTL/(LEL or LELs)/ETL, and the layer structure of the $N^{th}$ EL unit adjacent to the anode preferably is of HTL/(LEL or LELs)/ETL/EIL, and the layer structure of the other EL units preferably is of HTL/(LEL or LELs)/ETL. In some instances, when the thickness of the LEL adjacent to the ETL is thicker than 20 nm, the ETL can be simply replaced by an EIL, and the EIL then serves the function of supporting both electron injection and electron transportation.

Considering the number of the LELs within a specific broadband EL unit in the tandem white OLED 300, the number of LELs can be changed typically from 3 to 1. Therefore, the broadband EL unit can include at least one HTL and three LELs, wherein each of the LELs has different color emission. The broadband EL unit can also include at least one HTL and two LELs, wherein each of the LELs has different color emission. The broadband EL unit can also include at least one HTL and one LEL having broadband emission. The LELs in each of the broadband EL units can have the same or different color emission. Similarly, considering the number of the LELs within a specific color-compensating EL unit in the tandem OLED 300, the color-compensating EL unit includes at least one light-emitting layer.

The organic layers in the EL units can be formed from small molecule OLED materials or polymeric LED materials, both known in the art, or combinations thereof. The corresponding organic layer in each EL unit in the tandem white OLED can be formed using the same materials as or different materials from those of the other corresponding organic layers. Some EL units can be polymeric and other units can be of small molecules (or non-polymeric), including fluorescent materials and phosphorescent materials.

The materials used to construct the color-compensating EL units can be found in numerous prior art. The materials used to construct the broadband EL units can be the same materials as used to construct the conventional white OLEDs disclosed by the prior art, such as, U.S. Patent Application Publication 2002/0025419 A1, the disclosure of which is hereby incorporated by reference, U.S. Pat. Nos. 5,683,823, 5,503,910, 5,405,709, 5,283,182, EP 1 187 235, EP 1 182 244, and JP 07-142169.

Each EL unit can be selected in order to improve performance or achieve a desired attribute, for example, light transmission through the OLED multilayer structure, drive voltage, luminance efficiency, manufacturability, device stability, and so forth. The number of EL units in the tandem white OLED is, in principle, equal to or more than 2. Preferably, the number of the EL units in the tandem white OLED is such that the luminance efficiency in units of cd/A is improved or maximized. For lamp applications, the number of EL units can be determined according to the maximum voltage of the power supply.

In order to reduce drive voltage for the tandem white OLED, it is desirable to make each EL unit as thin as possible without compromising the electroluminescence efficiency. It is preferable that each EL unit is less than 500 nm thick, and more preferable that it be 2-250 nm thick. It is also preferable that each layer within the EL unit be 200 nm thick or less, and more preferable that it be 0.1-100 nm. It is also preferable that the thickness of each LEL in the EL unit be in the range of from 5 nm to 50 nm.

For a tandem white OLED to function efficiently, it is necessary that the intermediate connector should provide effective carrier injection into the adjacent EL units. Due to their lower resistivity than that of organic materials, metals, metal compounds, or other inorganic compounds can be effective for carrier injection. However, low resistivity can cause low sheet resistance resulting in pixel crosstalk. If the lateral current passing through the adjacent pixels to cause pixel crosstalk is limited to less than 10% of the current used to drive a pixel, the lateral resistance of the intermediate connector ($R_{ic}$) should be at least 8 times the resistance of the tandem white OLED. Typically, the static resistance between two electrodes of a conventional OLED is about several kΩs, and a tandem white OLED should have a resistance of about 10 kΩ or several 10 kΩs between the two electrodes. Therefore $R_{ic}$ should be greater than 100 kΩ. Considering the space between each pixel is smaller than one square, the sheet resistance of the intermediate connector should be then greater than 100 kΩ per square (lateral resistance equals to sheet resistance times the number of square). Because the sheet resistance is determined by both the resistivity and the thickness of the films (sheet resistance equals to film resistivity divided by film thickness), when the layers constituting an intermediate connector are selected from metals, metal compounds, or other inorganic compounds having low resistivity, a sheet resistance of the intermediate connector greater than 100 kΩ per square can still be achievable if the layers are thin enough. On the other hand, if organic materials are used for the construction of the intermediate connector, there will be no pixel crosstalk because the electrical resistance is high enough. However, pure organic layer cannot facilitate the carrier injection or carrier generation within the intermediate connector. Therefore, doped organic layers with improved semiconducting properties are also possible to be used in the intermediate connectors.

Another requirement for the tandem white OLED to function efficiently is that the optical transparency of the layers constituting the EL units and the intermediate connectors be as high as possible to permit for radiation produced in the organic white EL units to exit the device. According to a simple calculation, if the optical transmission of each intermediate connector is 70% of the emitting light, a tandem white OLED will not have much benefit because no matter how many EL units there are in the device, the electroluminance efficiency can never be doubled when comparing to a conventional device. The layers constituting the organic EL units are generally optically transparent to the radiation produced by the EL units, and therefore their transparency is generally not a concern for the construction of the tandem white OLEDs. As is known, metals, metal compounds, or other inorganic compounds can have low transparency. However, when the layers constituting an intermediate connector are selected from the metals, metal compounds, or other inorganic compounds, an optical transmission higher than 70% can still be achievable if the layers are thin enough. Preferably, the intermediate connector has at least 75% optical transmission in the visible region of the spectrum.

Figure 6:
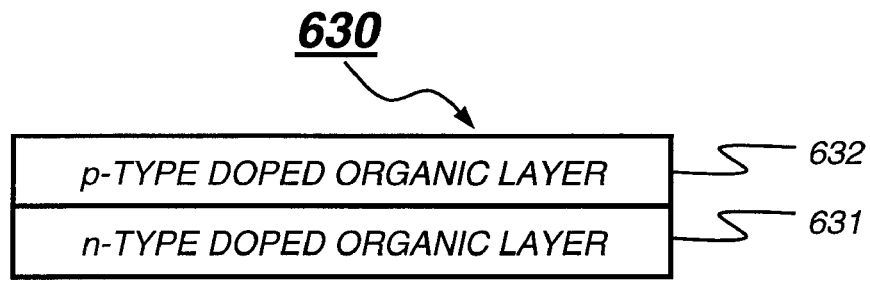
FIG. 6 depicts a schematic cross sectional view of an intermediate connector, having an n-type doped organic layer and a p-type doped organic layer, in the tandem white OLED in accordance with the present invention.
Figure 7:
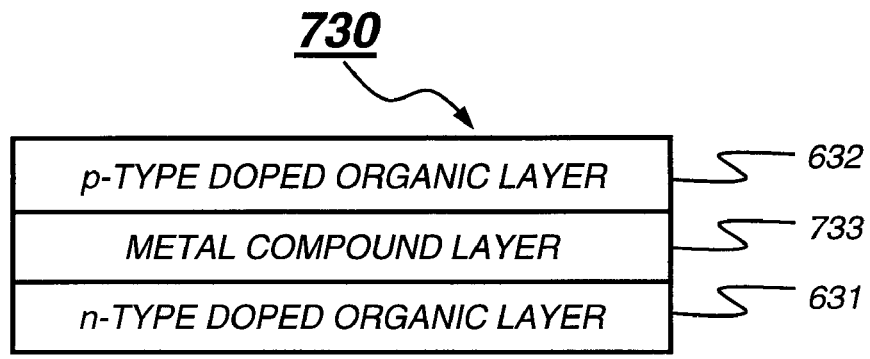
FIG. 7 depicts a schematic cross sectional view of another intermediate connector, having an n-type doped organic layer, a metal compound layer, and a p-type doped organic layer, in the tandem white OLED in accordance with the present invention.
Figure 8:
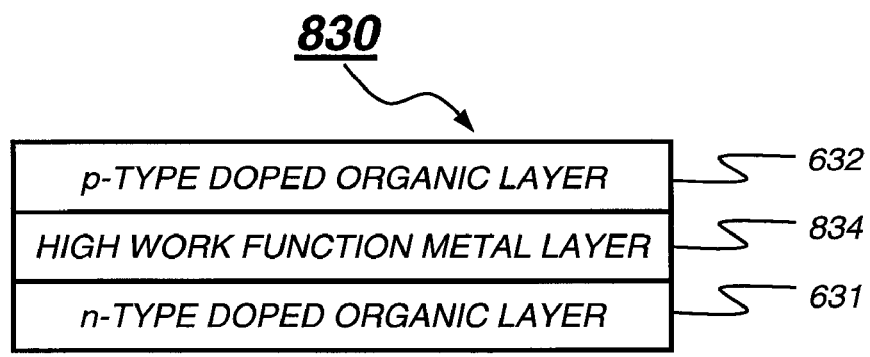
FIG. 8 depicts a schematic cross sectional view of another intermediate connector, having an n-type doped organic layer, a high work function metal layer, and a p-type doped organic layer, in the tandem white OLED in accordance with the present invention.
Figure 9:
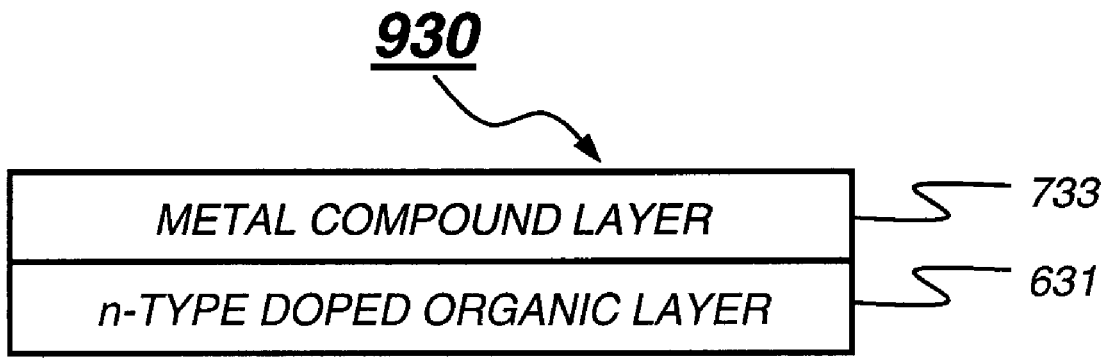
FIG. 9 depicts a schematic cross sectional view of another intermediate connector, having an n-type doped organic layer and a metal compound layer, in the tandem white OLED in accordance with the present invention.
Figure 10:
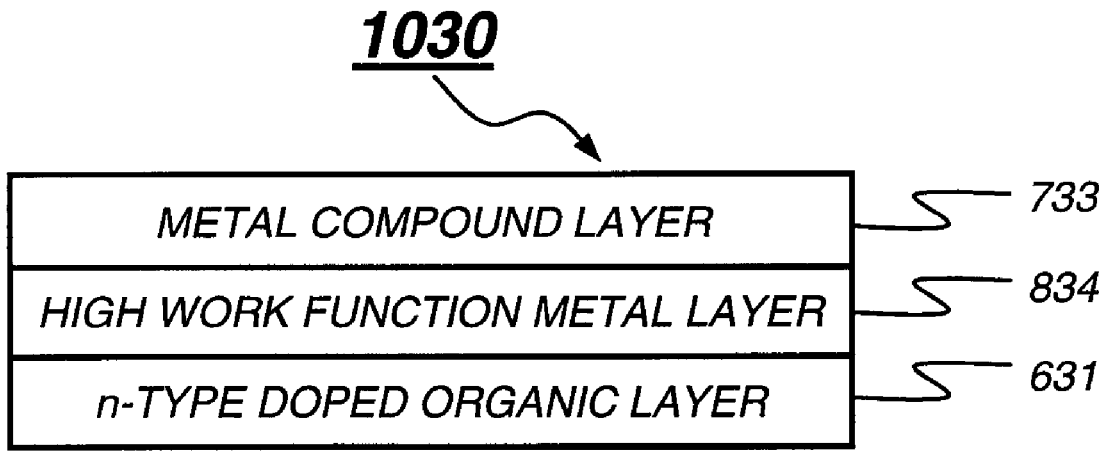
FIG. 10 depicts a schematic cross sectional view of another intermediate connector, having an n-type doped organic layer, a high work function metal layer, and a metal compound layer, in the tandem white OLED in accordance with the present invention.
Figure 11:
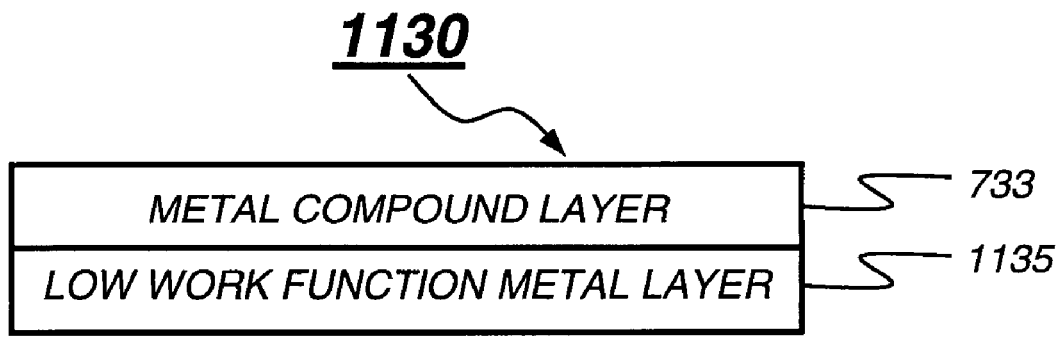
FIG. 11 depicts a schematic cross sectional view of another intermediate connector, having a low work function metal layer and a metal compound layer, in the tandem white OLED in accordance with the present invention.
Figure 12:
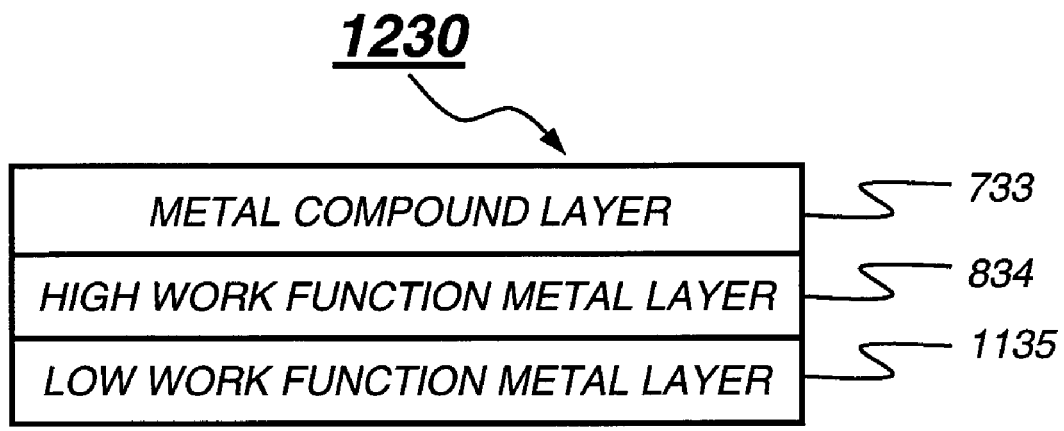
FIG. 12 depicts a schematic cross sectional view of another intermediate connector, having a low work function metal layer, a high work function metal layer, and a metal compound layer, in the tandem white OLED in accordance with the present invention.
Figure 13:
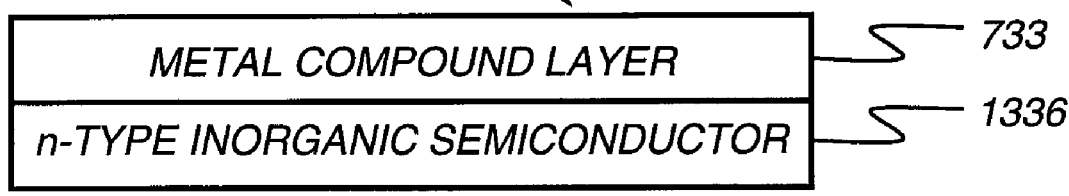
FIG. 13 depicts a schematic cross sectional view of another intermediate connector, having an n-type inorganic semiconductor layer and a metal compound layer, in the tandem white OLED in accordance with the present invention.
Figure 14:
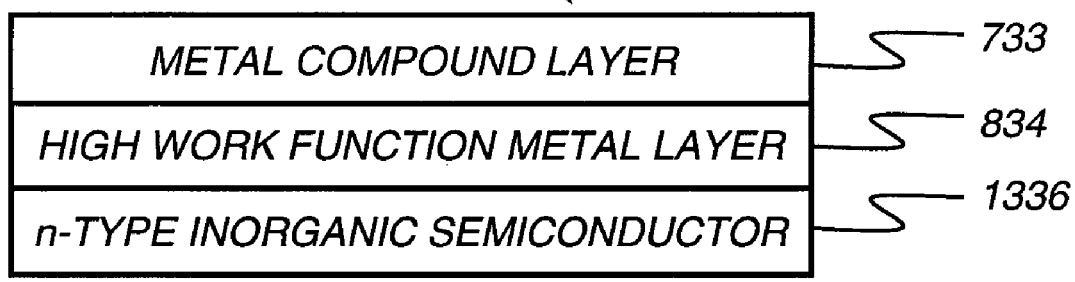
FIG. 14 depicts a schematic cross sectional view of another intermediate connector, having an n-type inorganic semiconductor layer, a high work function metal layer, and a metal compound layer, in the tandem white OLED in accordance with the present invention.

Therefore, the intermediate connectors provided between adjacent EL units are crucial, as they are needed to provide for efficient electron and hole injection into the adjacent EL units without causing pixel crosstalk and without compromising the optical transparency. Shown from FIG. 6 to FIG. 14 are typical embodiments of the intermediate connectors in the present invention, wherein the intermediate connector disposed between each adjacent EL unit includes at least two different layers without direct connection to external power source. These two or more than two different layers in the intermediate connector can comprise totally organic materials, or partially organic materials, or totally inorganic materials, provided that they can have both effective carrier injection and effective optical transparency. Shown in FIG. 6 is an intermediate connector 630 including an n-type doped organic layer 631 disposed adjacent to the ETL of the preceding organic EL unit and a p-type doped organic layer 632 disposed over the n-type doped organic layer 631; shown in FIG. 7 is an intermediate connector 730 including, in sequence, an n-type doped organic layer 631 disposed adjacent to the ETL of the preceding organic EL unit, a metal compound layer 733, and a p-type doped organic layer 632; shown in FIG. 8 is an intermediate connector 830 including, in sequence, an n-type doped organic layer 631 disposed adjacent to the ETL of the preceding organic EL unit, a high work function metal layer 834, and a p-type doped organic layer 632; shown in FIG. 9 is an intermediate connector 930 including an n-type doped organic layer 631 disposed adjacent to the ETL of the preceding organic EL unit and a metal compound layer 733 disposed over the n-type doped organic layer 631, wherein the intermediate connector has a sheet resistance of higher than 100 kΩ per square; shown in FIG. 10 is an intermediate connector 1030 including, in sequence, an n-type doped organic layer 631 disposed adjacent to the ETL of the preceding organic EL unit, a high work function metal layer 834, and a metal compound layer 733, wherein the intermediate connector has a sheet resistance of higher than 100 kΩ per square; shown in FIG. 11 is an intermediate connector 1130 including a low work function metal layer 1135 disposed adjacent to the ETL of the preceding organic EL unit and a metal compound layer 733 disposed over the low work function metal layer 1135, wherein the intermediate connector has a sheet resistance of higher than 100 kΩ per square; shown in FIG. 12 is an intermediate connector 1230 including, in sequence, a low work function metal layer 1135 disposed adjacent to the ETL of the preceding organic EL unit, a high work function metal layer 834, and a metal compound layer 733, wherein the intermediate connector has a sheet resistance of higher than 100 kΩ per square; shown in FIG. 13 is an intermediate connector 1330 including an n-type inorganic semiconductor layer 1336 disposed adjacent to the ETL of the preceding organic EL unit and a metal compound layer 733 disposed over the n-type inorganic semiconductor layer 1336, wherein the intermediate connector has a sheet resistance of higher than 100 kΩ per square; and shown in FIG. 14 is an intermediate connector 1430 including, in sequence, an n-type inorganic semiconductor layer 1336 disposed adjacent to the ETL of the preceding organic EL unit, a high work function metal layer 834, and a metal compound layer 733, wherein the intermediate connector has a sheet resistance of higher than 100 kΩ per square. Moreover, in the tandem white OLED, each of the intermediate connectors can have the same or different layer structures.

The n-type doped organic layer 631 in the aforementioned intermediate connectors contains at least one host organic material and one n-type dopant, wherein the host organic material is capable of supporting electron transport. The organic electron-transporting materials used in conventional OLEDs represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang (U.S. Pat. No. 4,356,429), various heterocyclic optical brighteners as disclosed by Van Slyke and Tang et al. (U.S. Pat. No. 4,539,507), triazines, hydroxyquinoline derivatives, benzazole derivatives, and phenanthroline derivatives. Silole derivatives, such as 2,5-bis(2',2"-bipridin-6-yl)-1,1-dimethyl-3,4-diphenyl silacyclopentadiene are also useful host organic materials. The combination of the aforementioned materials is also useful to form the n-typed doped organic layer. More preferably, the host organic material in the n-type doped organic layer 631 includes Alq, 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3, 5-triazine] (TRAZ), or combinations thereof.

The n-type dopant in the n-type doped organic layer 631 includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their compounds, are particularly useful. The materials used as the n-type dopants in the n-type doped organic layer of the doped organic connectors also include organic reducing agents with strong electron-donating properties. By "strong electron-donating properties" it is meant that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped organic layer 631 includes Li, Na, K, Rb, Cs, Mg, Ca, Sr, Ba, La, Ce, Nd, Sm, Eu, Th, Dy, or Yb, or combinations thereof. The n-type doped concentration is preferably in the range of 0.01-20 vol. %. The thickness of the n-type doped organic layer is typically less than 150 nm, and preferably in the range of about 1 to 100 nm.

When there is an n-type doped organic layer 631 in the intermediate connector, it is not necessary to use an EIL in the adjacent EL unit because this n-type doped organic layer 631 can facilitate the electron injection in both the adjacent EL unit and the intermediate connector.

The p-type doped organic layer 632 in the aforementioned intermediate connectors contains at least one host organic material and one p-type dopant, wherein the host organic material is capable of supporting hole transport. The hole-transporting materials used in conventional OLEDs represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Other suitable triarylamines substituted with one or more vinyl radicals and/or comprising at least one active hydrogen-containing group are disclosed by Brantley et al. (U.S. Pat. No. 3,567,450 and U.S. Pat. No. 3,658,520). A more preferred class of aromatic tertiary amines are those which include at least two aromatic tertiary amine moieties as described by Van Slyke and Tang et al. (U.S. Pat. Nos. 4,720,432 and 5,061,569). Non-limiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB). The combination of the aforementioned materials is also useful to form the p-typed doped organic layer. More preferably, the host organic material in the p-type doped organic layer 632 includes NPB, TPD, TNB, 4,4',4"-tris(N-3-metylphenyl-N-phenyl-amino)-triphenylamine (m-MTDATA), or 4,4',4"-tris(N,N-diphenyl-amino)-triphenylamine (TDATA), or combinations thereof.

The p-type dopant in the p-type doped organic layer 632 includes oxidizing agents with strong electron-withdrawing properties. By "strong electron-withdrawing properties" it is meant that the organic dopant should be able to accept some electronic charge from the host to form a charge-transfer complex with the host material. Some non-limiting examples include organic compounds such as 2,3,5,6-tetrafluoro-7,7,8, 8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of the p-type dopants is also useful to form the p-type doped organic layer 632. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can comprise small molecule materials or a polymeric materials, or combinations thereof. In some instances, the same host material can be used for both n-typed and p-type doped organic layers, provided that it exhibits both hole and electron transport properties set forth above. Examples of materials that can be used as host for either the n-type or p-type doped organic layers include, but are not limited to, various anthracene derivatives as described in U.S. Pat. No. 5,972, 247, certain carbazole derivatives, such as 4,4-bis(9-dicarbazolyl)-biphenyl (CBP), and distyrylarylene derivatives such as 4,4'-bis(2,2'-diphenyl vinyl)-1,1'-biphenyl and as described in U.S. Pat. No. 5,121,029.

The metal compound layer 733 in the intermediate connector 730 as shown in FIG. 9 is mainly used to stop the possible interdiffusion between the n-typed doped organic layer and the p-type doped organic layer and to stabilize the drive voltage during operation. In the other cases, such as shown in FIGS. 9-14, when the metal compound layer 733 is the top layer of the intermediate connector (or the metal compound layer 733 is adjacent to the HTL of the next EL unit), this layer can modify the interface between this layer and the HTL, and improve the hole injection between the intermediate connector and the EL unit.

The metal compound layer 733 can be selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The metal compound layer 733 can be selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 733 can be selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 733 can be selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 733 can be selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The metal compound layer 733 can also be selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. The metal compound layer 733 can be selected from $MoO_3$, $NiMoO_4$, $CuMoO_4$, $WO_3$, $ZnTe$, $Al_4C_3$, $AlF_3$, $B_2S_3$, $CuS$, $GaP$, $InP$, or $SnTe$. Preferably, the metal compound layer 733 is selected from $MoO_3$, $NiMoO_4$, $CuMoO_4$, or $WO_3$.

The high work function metal layer 834 inserted in the middle of the intermediate connectors is mainly used to stop the possible interdiffusion and facilitate the carrier injection between the other two layers in the intermediate connectors. The high work function metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer 834 includes Ag, Al, Cu, Au, Zn, In, or Sn, or combinations thereof. More preferably, the high work function metal layer 834 includes Ag or Al.

The low work function metal layer 935 in the intermediate connectors is mainly used to modify the interface between this layer and the ETL of the preceding organic white EL unit to improve the electron injection between the intermediate connector and the organic white EL unit. The low work function metal used to form this layer has a work function less than 4.0 eV and includes Li, Na, K, Rb, Cs, Mg, Ca, Sr, Ba, La, Ce, Nd, Sm, Eu, Th, Dy, or Yb, or combinations thereof. Preferably, the low work function metal layer 935 includes Li, Na, Cs, Ca, Ba, or Yb.

The n-type inorganic semiconductor layer 1336 in the intermediate connectors is mainly used to modify the interface between this layer and the ETL of the preceding organic white EL unit and improve the electron injection between the intermediate connector and the organic white EL unit. The n-type inorganic semiconductor layer 1336 includes, but is not limited to, ZnSe, ZnS, ZnSSe, SnSe, SnS, SnSSe, $LaCuO_3$, $La_4Ru_6O_{19}$, or $C_{60}$. Preferably, the n-type inorganic semiconductor layer 1336 includes ZnSe or ZnS.

In the case that there is an n-type inorganic semiconductor layer 1336 in the intermediate connector, it is not necessary to use an EIL in the adjacent organic white EL unit because this n-type inorganic semiconductor layer 1336 can facilitate the electron injection in both the adjacent organic white EL unit and the intermediate connector.

The thickness of each layer in the intermediate connector is in the range of from 0.1 nm to 150 nm. The thickness of the metal compound layer 733 in the intermediate connector is in the range of from 0.5 nm to 20 nm. The thickness of the high work function metal layer 834 in the intermediate connector is in the range of from 0.1 nm to 5.0 nm. The thickness of the low work function metal layer 1135 in the intermediate connector is in the range of from 0.1 nm to 10 nm. And the thickness of the n-type inorganic semiconductor layer 1336 in the intermediate connector is in the range of from 0.5 nm to 20 nm.

The tandem white OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 110, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque, or reflective. Example conductors for this application include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to reduce electrical shorts or enhance reflectivity.

When light emission is viewed solely through the anode, the cathode 170 used in the present invention can be comprised of nearly any conductive material. Desirable materials have effective film-forming properties to ensure effective contact with the underlying organic layer, promote electron injection at low voltage, and have effective stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin inorganic EIL in contact with an organic layer (e.g., ETL), which is capped with a thicker layer of a conductive metal. Here, the inorganic EIL preferably includes a low work-function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, JP 3,234,963, and EP 1076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

The broadband EL units and the intermediate connectors can be produced by thermal evaporation, electron beam evaporation, ion sputtering technique, or spin coating. Preferably, a thermal evaporation method is used for the deposition of all the materials in the fabrication of the tandem white OLED including the EL units, the intermediate connectors, and the electrode over the top organic EL unit.

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

EXAMPLES

The following examples are presented for a further understanding of the present invention. In the following examples, the thickness of the organic layers and the doping concentrations were controlled and measured in situ using calibrated thickness monitors (INFICON IC/5 Deposition Controller). The EL characteristics of all the fabricated devices were evaluated using a constant current source (KEITHLEY 2400 SourceMeter) and a photometer (PHOTO RESEARCH SpectraScan PR 650) at the room temperature.

Example 1

Comparative

The preparation of a comparative white OLED is as follows: A~1.1 mm thick glass substrate coated with a transparent indium-tin-oxide (ITO) conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the hole-injecting layer by decomposing $CHF_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately $10^{-6}$ Torr:

1. EL Unit:
   a) an HTL, about 90 nm thick, including "4,4'-bis[N-(1-naphthyl)-N-phenylamino]biphenyl" (NPB);
   b) a first LEL, 20 nm thick, including 70 vol. % NPB, 29.5 vol. % rubrene, and 0.5 vol. % "5,10,15,20-tetraphenylbisbenz[5,6]indeno[1,2,3-cd: 1',2',3'-1 m]perylene" (red emitting layer);
   c) a second LEL, 40 nm thick, including 87 vol. % "2-(1, 1-dimethyethyl)-9,10-di-2-naphthalenyl anthracene" (TBADN), 9 vol. % NPB, and 4 vol. % "4-(di-p-tolylamino)-4'-[(di-p-tolylamino)styryl]stilbene" (blue emitting layer); and
   d) an ETL, 10 nm thick, including "tris(8-hydroxyquinoline)-aluminum" (Alq).
2. Cathode: approximately 210 nm thick, including MgAg (formed by coevaporation of about 95 vol. % Mg and 5 vol. % Ag).

After the deposition of these layers, the device was transferred from the deposition chamber into a dry box (VAC Vacuum Atmosphere Company) for encapsulation.

Figure 15:
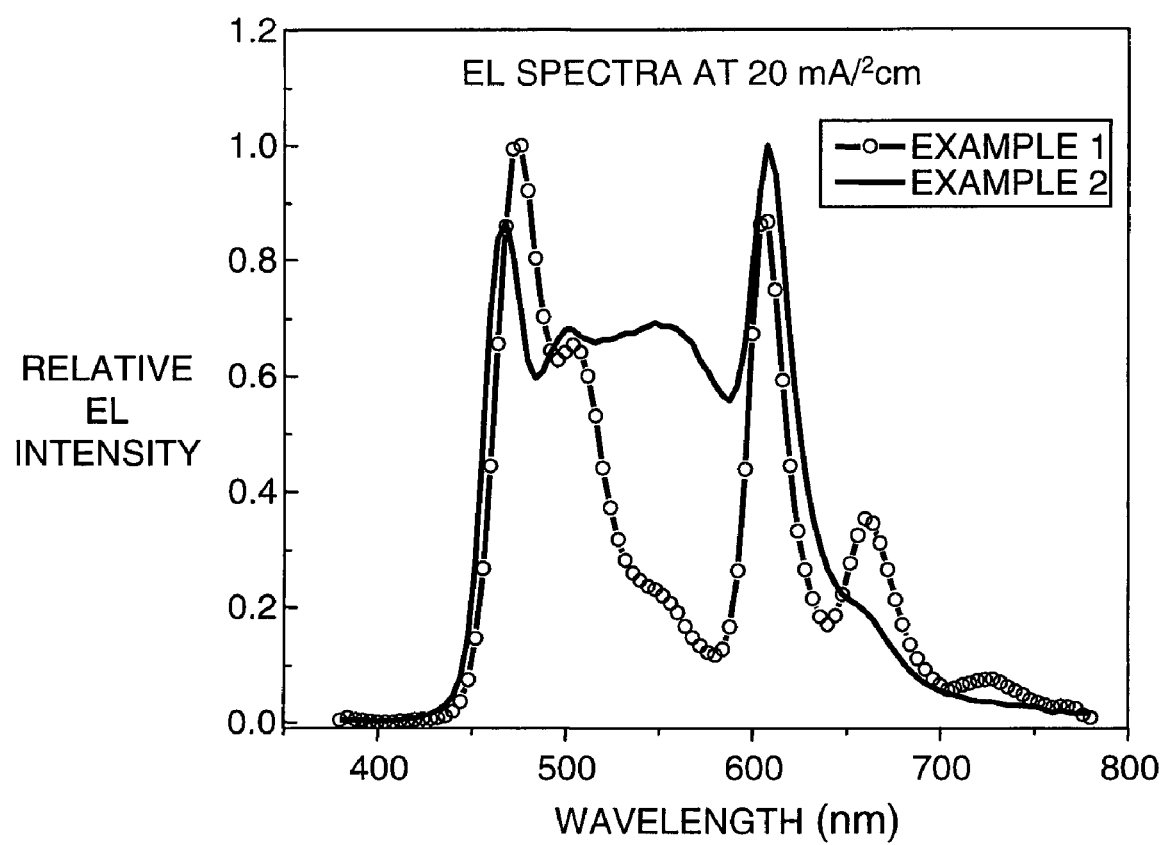
FIG. 15 is a graph of electroluminescence spectra of Examples 1 and 2.

The EL spectrum of Example 1 measured at 20 mA/cm² is shown in FIG. 15.

Example 2

A tandem white OLED was constructed in accordance with the present invention as described in FIG. 4. The fabrication methods used in Example 2 are similar to those used in Example 1, and the deposited layer structure is:

1. $1^{st}$ EL Unit ($1^{st}$ Broadband EL Unit):
   a) an HTL, about 30 nm thick, including NPB;
   b) a first LEL, 30 nm thick, including 70 vol. % NPB, 29.5 vol. % rubrene, and 0.5 vol. % "5,10,15,20-tetraphenylbisbenz[5,6]indeno[1,2,3-cd: 1',2',3'-1 m]perylene" (red emitting layer);
   c) a second LEL, 40 nm thick, including 85 vol. % "2-(1, 1-dimethyethyl)-9,10-di-2-naphthalenyl anthracene" (TBADN), about 13.5 vol. % NPB, and 1.5 vol. % "2,5, 8,11-tetra-t-butylperylene (TBP)" (blue emitting layer); and
   d) an ETL, 10 nm thick, including Alq.
2. $1^{st}$ Intermediate Connector:
   a) an n-type doped organic layer, 10 nm thick, including Alq doped with about 1.2 vol. % lithium; and
   b) a metal compound layer, 2 nm thick, including $WO_3$.
3. $2^{nd}$ EL Unit ($1^{st}$ Color-compensating EL Unit):
   a) an HTL, about 50 nm thick, including NPB;
   b) a LEL, 30 nm thick, including Alq; and
   c) an ETL, 30 nm thick, including Alq doped with about 1.2 vol. % lithium.
4. Cathode: approximately 210 nm thick, including MgAg.

The EL spectrum of Example 2 measured at 20 mA/cm² is shown in FIG. 15.

As is seen in FIG. 15, the conventional white OLED (Example 1) has a relatively weak emission in the green spectral region. However, the tandem white OLED (Example 2) with a green color-compensating EL unit has an improved white color due to the increased intensity of the green component in the spectral region. After passing through the color filters, the emission can give more balanced red, green, and blue colors.

The invention has been described in detail with particular reference to certain preferred embodiments thereof, but it will be understood that variations and modifications can be effected within the spirit and scope of the invention.

PARTS LIST 100 tandem white OLED (prior art)
110 anode 120.1 1$^{st}$ EL unit with blue emission (or 1$^{st}$ EL unit—blue)
120.2 2$^{nd}$ EL unit with red emission (or 1$^{st}$ EL unit—red)
130.1 charge generating layer (CGL)
170 cathode
180 voltage/current source
190 electrical conductors
200 tandem white OLED (prior art)
220.1 1$^{st}$ EL unit with blue emission (or 1$^{st}$ EL unit—blue)
220.2 2$^{nd}$ EL unit with green emission (or 2$^{nd}$ EL unit—green)
220.3 3$^{rd}$ EL unit with red emission (or 3$^{rd}$ EL unit—red)
230.1 1$^{st}$ intermediate connector (or 1$^{st}$ int. connector)
230.2 2$^{nd}$ intermediate connector (or 2$^{nd}$ int. connector)
300 tandem white OLED
320.1 1$^{st}$ broadband EL unit (or 1$^{st}$ broadb. EL unit)
320.2 2$^{nd}$ broadband EL unit (or 2$^{nd}$ broadb. EL unit)
320.N N$^{th}$ broadband EL unit (or N$^{th}$ broadb. EL unit)
330.1 1$^{st}$ intermediate connector (or 1$^{st}$ int. connector)
330.2 2$^{nd}$ intermediate connector (or 2$^{nd}$ int. connector)
330.(2N−1) (2N−1)$^{th}$ intermediate connector (or (2N−1)$^{th}$ int. connector)
340.1 1$^{st}$ color-compensating EL unit (or 1$^{st}$ compen. EL unit)
340.N N$^{th}$ color-compensating EL unit (or N$^{th}$ compen. EL unit)
400 tandem white OLED having one broadband EL unit and one color-compensating EL unit
500 tandem white OLED having two broadband EL units and one color-compensating EL unit
630 intermediate connector
631 n-type doped organic layer
632 p-type doped organic layer
730 intermediate connector
733 metal compound layer
830 intermediate connector
834 high work function metal layer
930 intermediate connector
1030 intermediate connector
1130 intermediate connector
1135 low work function metal layer
1230 intermediate connector
1330 intermediate connector
1336 n-type inorganic semiconductor layer (or n-type inorganic semiconductor)
1430 intermediate connector

The invention claimed is:

1. A tandem white OLED comprising:
 a) an anode;
 b) a cathode;
 c) at least one broadband electroluminescent unit disposed between the anode and the cathode, wherein the broadband electroluminescent unit includes at least one light-emitting layer and produces at least one color component having an intensity less than desired, and wherein one of the broadband electroluminescent unit(s) includes at least three light-emitting layers, and wherein each of the light-emitting layers has a different color of emission;
 d) at least one color-compensating electroluminescent unit disposed between the anode and the cathode, wherein the color-compensating electroluminescent unit is selected to produce the at least one color component and to increase the color component intensity, and wherein the color-compensating electroluminescent unit includes means for providing electron-hole recombination to produce light; and
 e) an intermediate connector disposed between each adjacent electroluminescent unit, wherein the intermediate connector has no direct connection to an external power source.

2. A tandem white OLED comprising:
 a) an anode;
 b) a cathode;
 c) at least one broadband electroluminescent unit disposed between the anode and the cathode, wherein the broadband electroluminescent unit includes at least one light-emitting layer and produces at least one color component having an intensity less than desired, and wherein one of the broadband electroluminescent unit(s) includes at least two light-emitting layers, and wherein each of the light-emitting layers has a different color of emission;
 d) at least one color-compensating electroluminescent unit disposed between the anode and the cathode, wherein the color-compensating electroluminescent unit is selected to produce the at least one color component and to increase the color component intensity, and wherein the color-compensating electroluminescent unit includes means for providing electron-hole recombination to produce light; and
 e) an intermediate connector disposed between each adjacent electroluminescent unit, wherein the intermediate connector has no direct connection to an external power source.

3. A tandem white OLED comprising:
 a) an anode;
 b) a cathode;
 c) at least one broadband electroluminescent unit disposed between the anode and the cathode, wherein the broadband electroluminescent unit includes at least one light-emitting layer and produces at least one color component having an intensity less than desire;
 d) at least one color-compensating electroluminescent unit disposed between the anode and the cathode, wherein the color-compensating electroluminescent unit is selected to produce the at least one color component and to increase the color component intensity, and wherein the color-compensating electroluminescent unit includes means for providing electron-hole recombination to produce light;
 e) an intermediate connector disposed between each adjacent electroluminescent unit, wherein the intermediate connector has no direct connection to an external power source; and
 f) wherein the color-compensating electroluminescent unit(s) have green color emission, and wherein the broadband electroluminescent unit(s) have a green color component with an intensity less than desired.

4. A tandem white OLED comprising:
 a) an anode;
 b) a cathode;
 c) a first broadband electroluminescent unit disposed between the anode and the cathode, wherein the first broadband electroluminescent unit includes at least one light-emitting layer and produces at least one color component having an intensity less than desired;
 d) at least one color-compensating electroluminescent unit disposed between the anode and the cathode, wherein the color-compensating electroluminescent unit is selected to produce the at least one color component and to increase the color component intensity, and wherein the color-compensating electroluminescent unit includes means for providing electron-hole recombination to produce light;

e) an intermediate connector disposed between each adjacent electroluminescent unit, wherein the intermediate connector has no direct connection to an external power source; and f) a second broadband electroluminescent unit disposed between the anode and the cathode, and wherein the color-compensating electroluminescent unit is disposed between first and second broadband electroluminescent units.

5. A tandem white OLED comprising:

a) an anode;

b) a cathode;

c) at least one broadband electroluminescent unit disposed between the anode and the cathode, wherein the broadband electroluminescent unit includes at least one light-emitting layer and produces at least one color component having an intensity less than desired;

d) at least one color-compensating electroluminescent unit disposed between the anode and the cathode, wherein the color-compensating electroluminescent unit is selected to produce the at least one color component and to increase the color component intensity, and wherein the color-compensating electroluminescent unit includes means providing electron-hole recombination to produce light;

e) an intermediate connector disposed between each adjacent electroluminescent unit, wherein the intermediate connector has no direct connection to an external power source; and f) wherein the color-compensating electroluminescent unit is disposed between two other color-compensating electroluminescent units.

* * * * *

UNITED STATES PATENT AND TRADEMARK OFFICE
CERTIFICATE OF CORRECTION

PATENT NO. : 7,560,862 B2
APPLICATION NO. : 10/970928
DATED : July 14, 2009
INVENTOR(S) : Liang-Sheng Liao et al.

It is certified that error appears in the above-identified patent and that said Letters Patent is hereby corrected as shown below:

Column 18, line 37    In Claim 3, delete "desire;" and insert -- desired; --, therefor.
Column 20, line 9    In Claim 5, delete "means" and insert -- means for --, therefor.

Signed and Sealed this

Nineteenth Day of January, 2010

David J. Kappos
*Director of the United States Patent and Trademark Office*